(12) United States Patent
Wang et al.

(10) Patent No.: US 9,905,626 B2
(45) Date of Patent: Feb. 27, 2018

(54) ARRAY SUBSTRATE, DISPLAY PANEL AND DISPLAY APPARATUS

(71) Applicants: BOE TECHNOLOGY GROUP CO., LTD., Beijing (CN); Chongqing BOE Optoelectronnics Technology Co., Ltd., Chongqing (CN)

(72) Inventors: Rui Wang, Beijing (CN); Fei Shang, Beijing (CN); Wu Wang, Beijing (CN); Shaoru Li, Beijing (CN)

(73) Assignees: BOE TECHNOLOGY GROUP CO., LTD., Beijing (CN); Chongqing BOE Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 14/802,807

(22) Filed: Jul. 17, 2015

(65) Prior Publication Data

US 2016/0163778 A1    Jun. 9, 2016

(30) Foreign Application Priority Data

Dec. 8, 2014    (CN) .......................... 2014 1 0743732

(51) Int. Cl.
*H01L 25/16* (2006.01)
*H01L 51/50* (2006.01)
(Continued)

(52) U.S. Cl.
CPC .... *H01L 27/3276* (2013.01); *G02F 1/136286* (2013.01); *H01L 25/167* (2013.01);
(Continued)

(58) Field of Classification Search
CPC ............ H01L 27/3244; H01L 27/3276; H01L 27/3262; H01L 27/14612; H01L 27/156;
(Continued)

(56) References Cited

U.S. PATENT DOCUMENTS 8,653,526 B1* 2/2014 Lei ....................... H01L 27/1255
257/59
2005/0162605 A1* 7/2005 Murade ................. G02F 1/1345
349/152
(Continued)

FOREIGN PATENT DOCUMENTS

CN    101064077 A    10/2007
CN    101154354 A    4/2008
(Continued)

OTHER PUBLICATIONS

Translation of CN102103293 A (Junxian et al) (Jun. 22, 2011), 9 pages.*

(Continued)

*Primary Examiner* — Caridad Everhart
(74) *Attorney, Agent, or Firm* — Kinney & Lange, P.A.

(57) ABSTRACT

Embodiments of the present invention provide an array substrate, a display panel and a display apparatus. They relate to the technical field of display technologies and can prevent the peripheral signal wirings of a display region from occupying non-display regions on both sides additionally. In this way, when the array substrate is applied in the display panel, the frame on both sides of the display region on the display panel may be omitted. The array substrate includes: a base substrate; signal lines located in positions on the base substrate corresponding to a display region of the array substrate; a pattern layer, in which the signal lines are arranged; and signal line wirings located between the pattern layer and the base substrate, wherein the signal line wirings are configured to input signals into the signal lines.

20 Claims, 4 Drawing Sheets

(51) Int. Cl.
*H01L 23/528* (2006.01)
*H01L 23/522* (2006.01)
*H01L 27/32* (2006.01)
*G02F 1/1362* (2006.01)

(52) U.S. Cl.
CPC ............... *H01L 2251/5315* (2013.01); *H01L 2924/0002* (2013.01)

(58) Field of Classification Search
CPC ......... H01L 2924/0002; H01L 2924/00; H01L 2251/5315; H01L 25/167; G02F 1/136286
See application file for complete search history.

(56) References Cited

U.S. PATENT DOCUMENTS

| | | | | |
|---|---|---|---|---|
| 2007/0247582 | A1* | 10/2007 | Mochizuki | G02F 1/1345 349/149 |
| 2010/0066658 | A1* | 3/2010 | Kim | G09G 3/3659 345/98 |
| 2012/0313907 | A1* | 12/2012 | Yamazaki | G02F 1/13454 345/205 |

FOREIGN PATENT DOCUMENTS

| | | |
|---|---|---|
| CN | 101556958 A | 10/2009 |
| CN | 101673015 A | 3/2010 |
| CN | 102103293 A | 6/2011 |
| CN | 104134429 A | 11/2014 |
| JP | 2007272243 A | 10/2007 |

OTHER PUBLICATIONS

Translation of CN 101673015 A (Maosong et al) (May 23, 2013), 13 pages.*
Machine Translation of CN101673015 A (Chen et al ) (May 23, 2012) "Active element array substrate and display panel", 10 pages.*
Machine Translation of CN102103293 A (Li et al) (Jun. 22, 2011) "Display panel with narrow frame and electronic device using display panel", 9 pages.*
First Chinese Office Action (including English translation) dated Sep. 18, 2016, for corresponding Chinese Application No. 201410743732.X.
Second Chinese Office Action, for Chinese Patent Application No. 201410743732.X, dated Apr. 12, 2017, 15 pages.
Chinese Rejection Decision, for Chinese Patent Application No. 201510130233.8, dated Oct. 11, 2017, 12 pages.

* cited by examiner

ARRAY SUBSTRATE, DISPLAY PANEL AND DISPLAY APPARATUS

CROSS-REFERENCE TO RELATED APPLICATION

This application claims the benefit of Chinese Patent Application No. 201410743732.X filed on Dec. 8, 2014 in the State Intellectual Property Office of China, the whole disclosure of which is incorporated herein by reference.

BACKGROUND OF THE INVENTION

Field of the Invention

The present disclosure relates to the field of display technologies, and in particular, relates to an array substrate, a display panel and a display apparatus.

Description of the Related Art

In the conventional array substrate, gate lines and data lines crossing with each other delimit a plurality of pixel units on the array substrate. These pixel units constitute a display region in the array substrate. In a non-display region around the display region, the array substrate further includes a driving integrated circuit unit configured to input signals into the gate lines and data lines.

In the conventional array substrate, all of peripheral wirings, such as a GOA (Gate Driver on Array) units, a gate scanning circuit signal lines or a gate scanning lines, need to be arranged in the non-display region on both sides of the display region.

SUMMARY OF THE INVENTION

An embodiment of the present invention provides an array substrate, comprising: a base substrate; signal lines located in positions on the base substrate corresponding to a display region of the array substrate; a pattern layer, in which the signal lines are arranged; and signal line wirings located between the pattern layer and the base substrate, wherein the signal line wirings are configured to input signals into the signal lines.

An embodiment of the present invention also provides a display panel comprising an array substrate, the array substrate comprising: a base substrate; signal lines located in positions on the base substrate corresponding to a display region of the array substrate; a pattern layer, in which the signal lines are arranged; and signal line wirings located between the pattern layer and the base substrate, wherein the signal line wirings are configured to input signals into the signal lines.

An embodiment of the present invention also provides a display apparatus comprising a display panel, the display panel comprising an array substrate, the array substrate comprising: a base substrate; signal lines located in positions on the base substrate corresponding to a display region of the array substrate; a pattern layer, in which the signal lines are arranged; and signal line wirings located between the pattern layer and the base substrate, wherein the signal line wirings are configured to input signals into the signal lines.

BRIEF DESCRIPTION OF THE DRAWINGS

The above and other features of the present invention will become more apparent by describing in detail exemplary embodiments thereof with reference to the accompanying drawings. The following drawings only show some embodiments of the present invention.

REFERENCE NUMERALS

Figure 1:
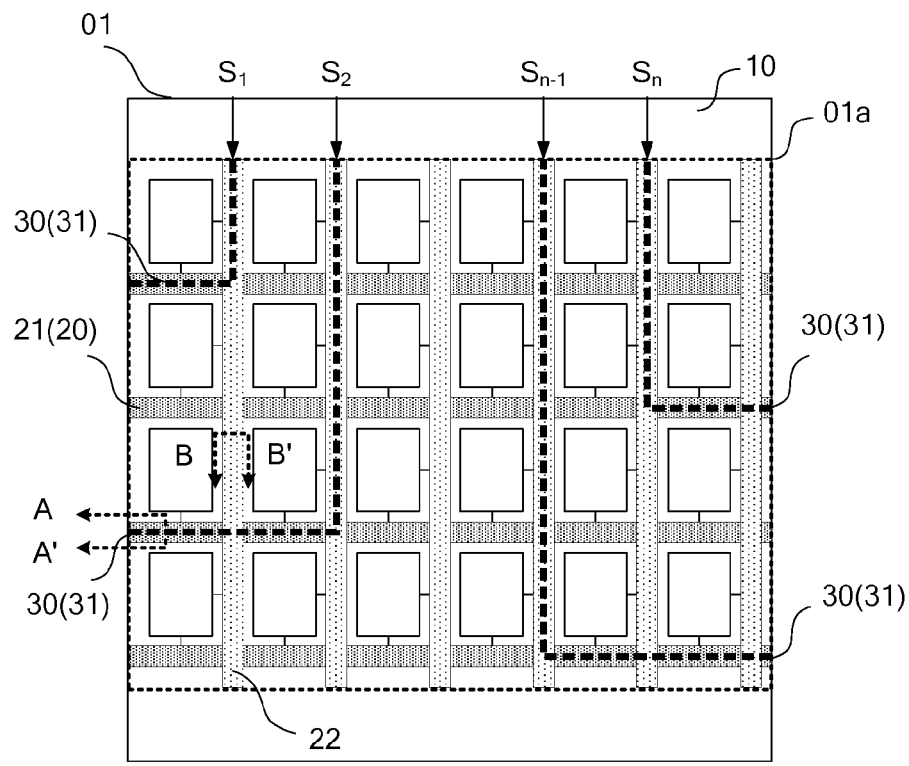
FIG. 1 is a top view schematically showing a structure of an array substrate according to an embodiment of the present invention.

01: array substrate 01a: display region 01b: non-display region

10: base substrate 20: signal line 21: gate line 22: data line

30: signal line wiring 31: gate line wiring 32: gate line wiring connection line

33: data line lead 34: gate scanning signal connection line

35: data line wiring 40: first insulation layer 41: first via hole

50: IC unit 51: source driving circuit unit

52: GOA signal unit 53: gate driving circuit unit 60: GOA unit

70: second insulation layer 71: second via hole 90: gate insulation layer

91: interlayer insulation layer 92: through hole

DETAILED DESCRIPTION OF PREFERRED EMBODIMENTS OF THE INVENTION

Exemplary embodiments of the present disclosure will be described clearly in detail with reference to the attached drawings. The embodiments are only given by way of examples, instead of all of embodiments of the present invention. All of the other embodiments that the skilled person in the art may obtain based on the embodiments of the present invention without taking inventive labors belong to the protect scope of the present invention.

According to a general concept of the present invention, it provides an array substrate, comprising: a base substrate; signal lines located in positions on the base substrate corresponding to a display region of the array substrate; a pattern layer, in which the signal lines are arranged; and signal line wirings located between the pattern layer and the base substrate, wherein the signal line wirings are configured to input signals into the signal lines.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As illustrated in FIG. 1, an embodiment of the present invention provides an array substrate 01. The array substrate 01 includes: a base substrate 10; and signal lines 20 located in positions on the base substrate 10 corresponding to a display region 01a of the array substrate 01. The array substrate 01 further includes: a pattern layer, in which the signal lines 20 are arranged; and signal line wirings 30 located between the pattern layer and the base substrate 10. The signal line wirings 30 are configured to input signals into the signal lines 20.

It should be noted that, at first, FIG. 1 only shows an example in that the signal lines 20 is gate lines 21. Certainly, the signal lines 20 may also be data lines 22 arranged to cross laterally and longitudinally with the gate lines 21.

In an example, as shown in FIG. 1, $S_i$ (i is a positive integer from 1 to N) represents signals inputted into the signal lines 20 in sequence. For example, when the signal lines 20 is the gate lines 21, the signals $S_i$ are the corresponding gate scanning signals inputted into the gate lines 21 in sequence.

In addition, FIG. 1 shows schematically potential wiring modes of the signal line wirings 30. The embodiments of the present invention are not limited to this.

Secondly, embodiments of the present invention do not limit the material of the signal line wirings 30 as long as the material is a conductive material which can transmit signal by electrical conduction.

In view of this, in the above array substrate 01 provided by the embodiment of the present invention, the signal line wirings 30 which input the corresponding signals into the signal lines 20 are located between the pattern layer in which the signal lines 20 are arranged and the base substrate 10, that is, located in the display region 01a of the array substrate 01, thus, it does not need to occupy additionally the spaces on both sides of the display region of the array substrate. After the array substrate 01 is applied to a display panel, it does not need to provide the space corresponding to the both sides of the display region 01a on the array substrate 01 to arrange the signal line wirings 30, thus, the frame on the both sides of the display panel may be omitted to achieve narrow frame effects such that the user can have better user's experiences in use. In addition, it may also improve the utilization ratio of the base substrate 10 in the array substrate 01 to reduce the cost of the array substrate.

As an example, the signal line wirings 30 may be made from transparent conductive material, for example, ITO (Indium Tin Oxide) or IZO (Indium Zinc Oxide) or the like. The above conductive material has a high transmittance to visible light and may be regarded as transparent material, and thus, when the array substrate is used in the display panel, the display effect will not be adversely affected no matter where the signal line wiring 30s are located in the display region 01a between the pattern layer in which the signal lines 20 are arranged and the base substrate 10. Thus, in this case, the specific positions of the signal line wirings 30 are not limited, that is, the signal line wirings 30 may be located in any position in the display region 01a between the pattern layer in which the signal lines 20 are arranged and the base substrate 10.

However, the transparent conductive material such as ITO or IZO has a greater resistance than the metal simple substance such as copper, and has greater power consumption when it is used as a wiring for signal transmission. In this way, the heat dissipation may become difficult. Thus, in an embodiment of the present invention, as an example, the signal line wirings 30 may be composed of metal simple substance and/or metal alloy material.

In this case, the metal simple substance and/or metal alloy material are/is not transmissive for visible light, that is, it is non-transparent material. Thus, the signal line wirings 30 are covered by the signal lines 20 in a direction perpendicular to a plane surface of the base substrate 10. As illustrated in FIG. 1, the signal line wirings 30 are parallel to the gate lines 21 and located below the gate lines 21. The line width of the signal line wirings 30 is smaller than or equal to the line width of the gate lines 21. The skilled person in the art should understand, with reference to FIG. 1, that in the display region 01a, the gate lines 21 and the data lines 22 arranged to cross with each other delimit a plurality of pixel units on the array substrate. These pixel units are effective display regions on the array substrate while the region in which the gate lines 21 and the data lines 22 are located is not used for display. In this way, the signal lines such as gate lines 21 do not occupy the effective display region itself, thus, the signal lines 20 cover the non-transparent signal line wirings 30 in a direction perpendicular to a plane surface of the base substrate 10, such that the signal line wirings 30 located between the pattern layer in which the signal lines 20 are arranged and the base substrate 10 will not influence on the normal display of the array substrate 01 after it is used in the display panel.

In view of the above, in the array substrate, the wirings that input gate scanning signals into the gate lines typically have greater areas and thus occupy more space on both sides of the display region. Thus, in an embodiment of the present invention, as illustrated in FIG. 1, the signal line wirings 30 include gate line wirings 31 configured to input the gate scanning signals $S_1 \sim S_N$ into the gate lines 21.

Figure 2A:
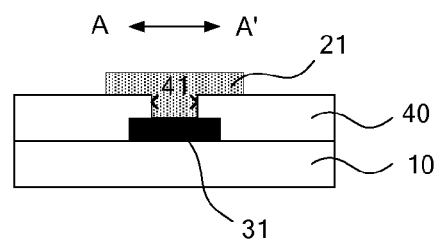
FIG. 2A is a schematic cross sectional view taken along A-A' direction shown in FIG. 1.

As an example, as shown in FIG. 2A, the array substrate 01 further includes a first insulation layer 40 located between the pattern layer in which the gate lines 21 are arranged (it may be called as a first pattern layer) and the base substrate 10. The gate line wirings 31 are located between the first insulation layer 40 and the base substrate 10.

In an example, the first insulation layer 40 is provided with first via holes 41 therein, the first via holes 41 being configured to connect the gate lines 21 with the gate line wirings 31.

It should be noted that, at first, the array substrate 01 further includes structures such as a gate insulation layer, an active layer, a source electrode and a drain electrode, or a pixel electrode. All of materials and production process for the structures may follow the prior arts. The details will be omitted. Herein, in order to show the connection of first insulation layer 40, the first via holes 41 and the gate line wirings 31 to the gate lines 21 through the first via holes 41, FIG. 2A does not show schematically the above structures such as the gate insulation layer, the active layer and the like.

Secondly, the array substrate 01 is provided with a plurality of the gate lines 21 arranged parallel to each other, and the gate scanning signals inputted into the respective gate lines 21 are different from each other. Thus, in order to prevent the gate line wirings connected to different gate lines 21 from contacting with each other, the gate line wirings 31 are connected to the gate lines 21 by the first via holes 41 in the first insulation layer 40 respectively.

Thirdly, in the embodiments of the present invention, the positions of the first via holes 41 are not limited. For example, they may be located in the interior of the display region 01a, or may be located at an edge of the display region 01a, as long as the gate line wirings 31 can be connected to the gate lines 21.

As an example, the signal line wirings 30 may also include data line wirings configured to input the corresponding source driving signals into the data lines 22.

Figure 2B:
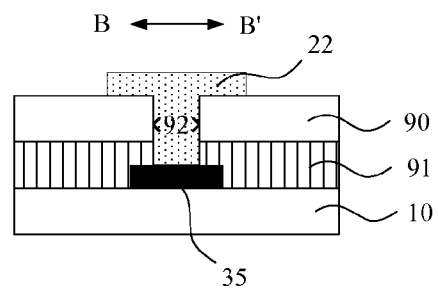
FIG. 2B is a schematic cross sectional view taken along B-B' direction shown in FIG. 1.

In this case, in order to prevent the signal line wirings 30 from contacting with the gate lines 21 to cause chaos in signal, thus, as shown in FIG. 2B, the array substrate 01 further includes an interlayer insulation layer 91 (for example an insulation layer composed of silicon nitride or silicon oxide) located between the pattern layer in which the data line wirings 35 are arranged and the gate insulation layer 90.

In an example, the gate insulation layer 90 is further formed therein with through holes 92 passing through the interlayer insulation layer 91. The through holes 92 communicate with the data line wirings 35, such that the data line wirings 35 communicate with the data lines 22 when the corresponding source driving signals are inputted into the data lines 22.

The array substrate 10 will be described below in details with reference to embodiments.

Figure 3:
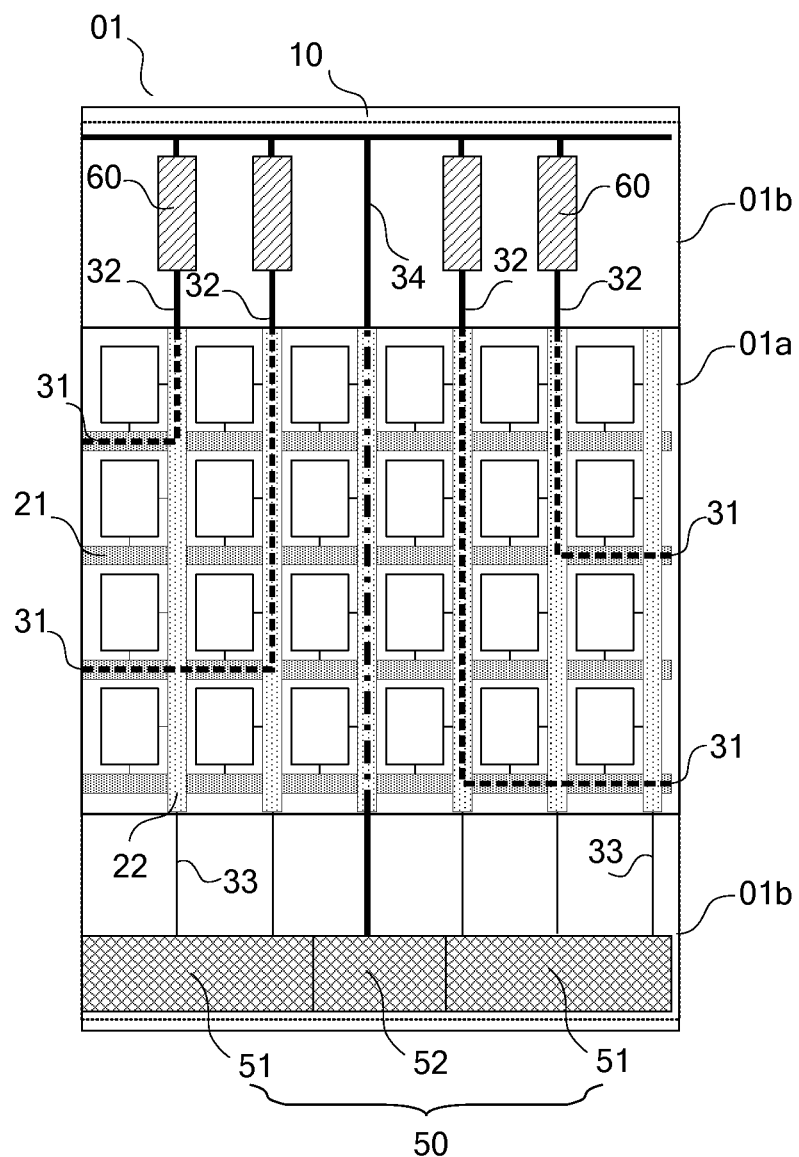
FIG. 3 is a top view schematically showing a structure of an array substrate according to a first embodiment of the present invention.

A first embodiment of the present invention provides an array substrate 01, as shown in FIG. 3. The array substrate 01 includes: a base substrate 10; and gate lines 21 located in a position on the base substrate 10 corresponding to a display region 01a of the array substrate 01. The array substrate 01 further includes: gate line wirings 31 located between a pattern layer in which the gate lines 21 are arranged and the base substrate 10. The gate line wirings 31 are configured to input signals into the gate lines 21.

In an example, the gate line wirings 31 are made from metal simple substance and/or metal alloy materials. The gate line wirings 31 are covered by the gate lines 21 in a direction perpendicular to a plane surface of the base substrate 10.

As an example, the array substrate 01 further includes a first insulation layer 40 (not shown in FIG. 3, but shown in FIG. 2A) located between the pattern layer in which the gate lines 21 are arranged and the base substrate 10. The gate line wirings 31 are located between the first insulation layer 40 and the base substrate 10.

The first insulation layer 40 is provided with first via holes 41 (not shown in FIG. 3, but shown in FIG. 2A) therein, the first via holes 41 being configured to connect the gate lines 21 with the gate line wirings 31.

The array substrate 01 further includes: data lines 22 arranged to cross with the gate lines 21; a driving integrated circuit (IC) unit 50 (called as IC unit for short) located in a position on the base substrate 10 corresponding to a non-display region 01b of the array substrate 01 and close to one end of each of the data lines 22, the driving integrated circuit unit 50 comprising a source driving circuit unit 51; a GOA unit 60 located in a position on the base substrate 10 corresponding to the non-display region 01b and close to the other end of each of the data lines 22; and gate line wiring connection lines 32 arranged in the same layer as the gate line wirings 31, the gate line wiring connection lines 31 being configured to connect the gate line wirings 31 with the GOA unit 60.

In the case that the gate line wiring connection lines 32 are made from non-transparent material, the gate line wiring connection lines 32 are parallel to the data lines 22 and the parts of the gate line wiring connection lines 32 overlapped with the data lines 22 are covered by the data lines 22 in a direction perpendicular to the plane surface of the base substrate 10.

Herein, in the display region 01a, the gate lines 21 and the data lines 22 arranged to cross with each other delimit a plurality of pixel units in the array substrate. These pixel units are effective display region in the array substrate while the region itself in which the gate lines 21 and the data lines 22 are arranged is not used for display. In this way, the data lines 22 itself do not occupy the effective display region, the data lines 22 cover the non-transparent gate line wiring connection lines 32 in the direction perpendicular to plane surface of the base substrate 10, such that the gate line wiring connection lines 32 cannot disturb the normal display of the display panel when the array substrate 01 is applied in the display panel.

As an example, the array substrate 01 further includes: data line leads 33 configured to connect the data lines 22 with the source driving circuit unit 51.

In view of this, the above array substrate 01 provided by the above embodiment of the present invention may omit the frame on both sides of the display region 01a along the direction of gate lines 21 after the array substrate 01 is applied in the display panel, such that the display panel meets the requirement of narrow frame design of the current display apparatus.

Further, as illustrated in FIG. 3, the driving integrated circuit unit 50 further includes a GOA signal unit 52 configured to input the corresponding signal into the GOA unit 60. The array substrate 01 further includes: gate scanning signal connection lines 34 arranged in the same layer as the gate line wiring connection lines 32 and configured to connect the GOA signal unit 52 with the GOA unit 60.

In the case that the gate scanning signal connection lines 34 are made from non-transparent material, the parts of the gate scanning signal connection lines 34 overlapped with the data lines 22 are covered by the data lines 22 in a direction perpendicular to the plane surface of the base substrate 10. In this way, the parts of the gate scanning signal connection lines 34 will not disturb the normal display of the display panel when the array substrate 01 is applied in the display panel.

Figure 4:
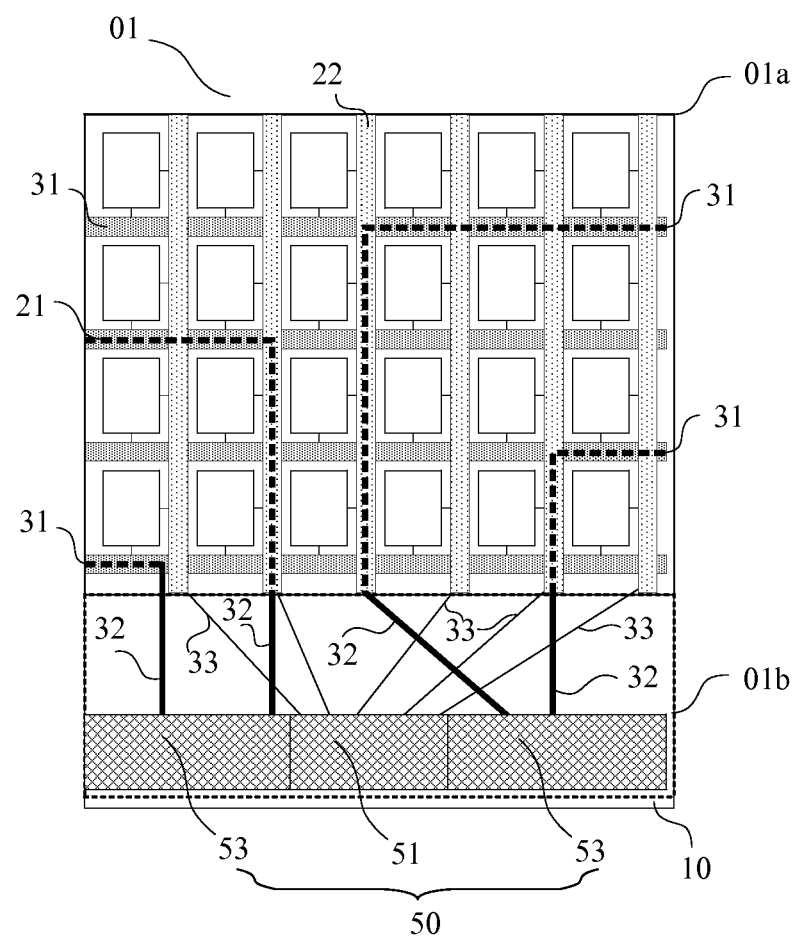
FIG. 4 is a top view schematically showing a structure of an array substrate according to a second embodiment of the present invention.

An embodiment of the present invention provides an array substrate 01, as shown in FIG. 4. The array substrate 01 includes: a base substrate 10; and gate lines 21 located in a position on the base substrate 10 corresponding to a display region 01a of the array substrate 01. The array substrate 01 further includes: gate line wirings 31 located between a pattern layer in which the gate lines 21 are arranged and the base substrate 10. The gate line wirings 31 are configured to input gate scanning signals into the gate lines 21.

As an example, the gate line wirings 31 may be made from metal simple substance and/or metal alloy materials. The gate line wirings 31 are covered by the gate lines 21 in a direction perpendicular to a plane surface of the base substrate 10.

The array substrate 01 further includes a first insulation layer 40 (not shown in FIG. 4, but shown in FIG. 2A) located between the pattern layer in which the gate lines 21 are arranged and the base substrate 10. The gate line wirings 31 are located between the first insulation layer 40 and the base substrate 10.

The first insulation layer 40 is provided with first via holes 41 (not shown in FIG. 4, but shown in FIG. 2A) therein, the first via holes 41 being configured to connect the gate lines 21 with the gate line wirings 31.

The array substrate 01 further includes: data lines 22 arranged to cross with the gate lines 21; a driving integrated circuit unit 50 located in a position on the base substrate 10 corresponding to a non-display region 01b of the array substrate 01 and close to one end of each of the data lines 22, the driving integrated circuit unit 50 comprising gate driving circuit unit 53 and a source driving circuit unit 51; and gate line wiring connection lines 32 arranged in the same layer as the gate line wirings 31, the gate line wiring connection lines 31 being configured to connect the gate line wirings 31 with the gate driving circuit unit 53.

In the case that the gate line wiring connection lines 32 are made from non-transparent material, the gate line wiring connection lines 32 are parallel to the data line 22 and the parts of the gate line wiring connection lines 32 overlapped with the data lines 22 are covered by the data lines 22 in the direction perpendicular to the plane surface of the base substrate 10. In this way, the parts of the non-transparent gate line wiring connection lines 32 in the display region 01a will not disturb the display effects of the display panel when the array substrate 01 is applied in the display panel.

As an example, the array substrate 01 further includes: data line leads 33 configured to connect the data lines 22 with the source driving circuit unit 51.

In view of this, the above array substrate 01 provided by the above embodiment of the present invention may omit the frame on both sides of the display region 01a along the direction of gate lines 21 after the array substrate 01 is applied in the display panel and may also omit the frame on the other side of the data lines 22 opposed to the driving integrated circuit unit 50, such that the display panel can omit the frame on three sides thereof and meet the requirement of narrow frame design of the current display apparatus.

Figure 5:
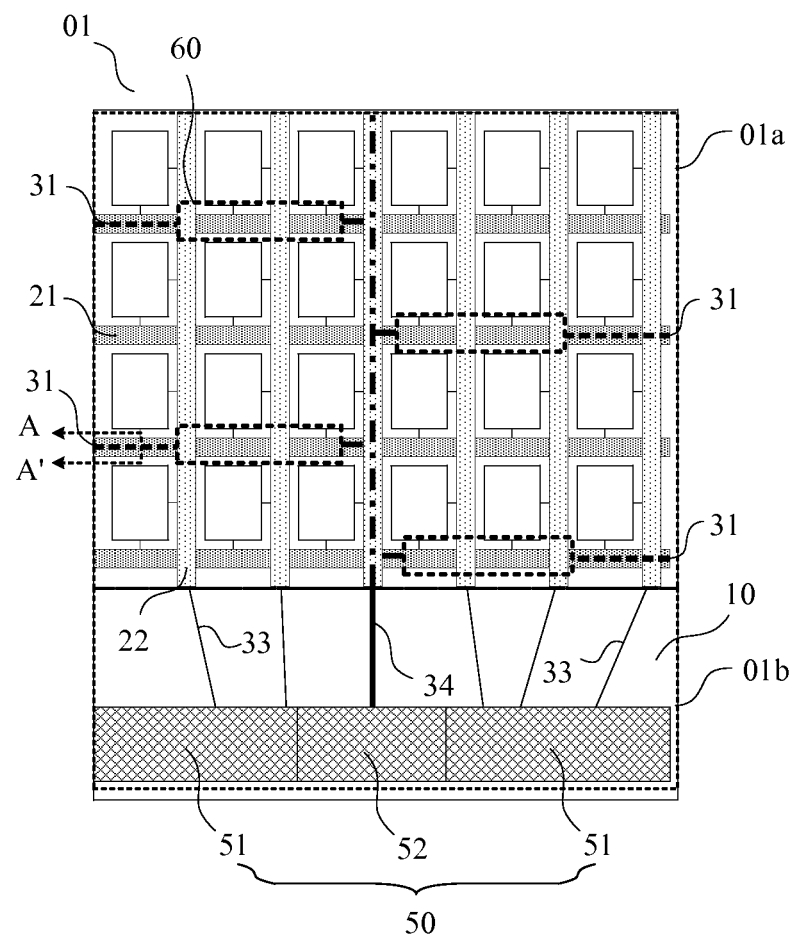
FIG. 5 is a top view schematically showing a structure of an array substrate according to a third embodiment of the present invention.

An embodiment of the present invention provides an array substrate 01, as shown in FIG. 5. The array substrate 01 includes: a base substrate 10; and gate lines 21 located in a position on the base substrate 10 corresponding to a display region 01a of the array substrate 01. The array substrate 01 further includes: gate line wirings 31 located between the pattern layer in which the gate lines 21 are arranged and the base substrate 10. The gate line wirings 31 are configured to input gate scanning signals into the gate lines 21.

The gate line wirings 31 may be made from metal simple substance and/or metal alloy materials. The gate line wirings 31 are covered by the gate lines 21 in a direction perpendicular to a plane surface of the base substrate 10.

Figure 6:
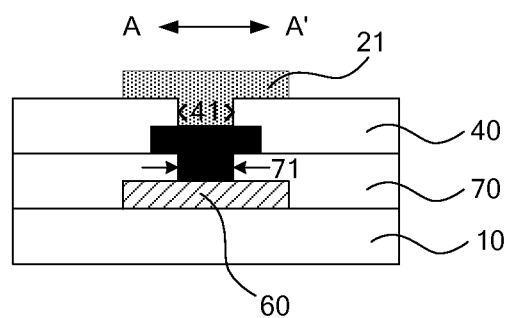
FIG. 6 is a schematic cross sectional view taken along A-A' direction shown in FIG. 5.

As shown in FIG. 6, the array substrate 01 further includes a first insulation layer 40 located between the pattern layer in which the gate lines 21 are arranged and the base substrate 10. The gate line wirings 31 are located between the first insulation layer 40 and the base substrate 10.

The first insulation layer 40 is provided with first via holes 41 (not shown in FIG. 4, but shown in FIG. 2A) therein, the first via holes 41 being configured to connect the gate lines 21 with the gate line wirings 31.

Further, the array substrate 01 further includes: data lines 22 arranged to cross with the gate lines 21, the data lines 22 and the gate lines 21 delimiting a plurality of pixel regions; and organic light emitting units (not shown) arranged in the pixel regions. The light emitting units are configured to emit light in a top emitting mode with respect to the base substrate 10. Herein, the top emitting mode is given in opposite to a bottom emitting mode. The bottom emitting mode means that the light emitted from the organic light emitting units passes through the base substrate 10 and then is emitted from the bottom of the base substrate 10.

With reference to FIG. 6, the array substrate 01 further includes: a second insulation layer 70 located between a pattern layer in which the gate line wirings 31 are arranged (called as a second pattern layer) and the base substrate 10; and a GOA unit located between the second insulation layer 70 and the base substrate 10. The second insulation layer 70 is provided with second via holes 71 therein, the second via holes 71 being configured to connect the GOA unit 60 with the gate line wirings 31.

The above array substrate 01 further includes: a driving integrated circuit unit 50 located in a position on the base substrate 10 corresponding to a non-display region 01b of the array substrate 01 and close to any end of each of the data lines 22, the driving integrated circuit unit 50 comprising a source driving circuit unit 51 and a GOA signal unit 52; and gate scanning signal connection lines 34 arranged in the same layer as the gate line wirings 31, the gate scanning signal connection lines 34 being configured to connect the gate line wirings 31 with the GOA signal unit 52.

In the case that the gate scanning signal connection lines 34 are made from non-transparent material, the parts of the gate scanning signal connection lines 34 overlapped with the data lines 22 are covered by the data lines 22 in a direction perpendicular to a plane surface of the base substrate 10. In this way, the parts of the non-transparent gate scanning signal connection lines 34 in the display region 01a will not disturb the display effects of the display panel when the array substrate 01 is applied in the display panel.

As the organic light emitting units in the array substrate 01 emit the light in the top emitting mode, thus the GOA unit 60 located between the second insulation layer 70 and the base substrate 10 will not disturb the display effects when the array substrate 01 is applied in an OLED display panel.

In view of this, the above array substrate 01 provided by the above embodiment of the present invention may omit the frame on both sides of the display region 01a along a direction of the gate lines 21 after the array substrate 01 is applied in the display panel. Meanwhile, as the array substrate 01 is applied in the OLED display panel with the top emitting mode, a GOA unit having a relatively large area may be arranged below layers where thin film transistors (TFT) and pixel electrodes are arranged on the array substrate 01 so as to omit the frame on the other side of the data lines 22 opposed to the driving integrated circuit unit 50. In this way, the OLED display panel can omit the frame on three sides thereof to meet the current requirement of narrow frame design of the display apparatus.

An embodiment of the present invention also provides a display panel including the array substrate 01 as described in any one of embodiments.

The display panel may for example be a liquid crystal display (LCD) panel, or an organic electroluminescence panel such as OLED display panel.

Further, an embodiment of the present invention further provides a display apparatus, comprising the above display panel.

When the display panel is a passive light emitting display panel such as an LCD panel, the display apparatus further includes arrangements such as a backlight source assembly configured to provide a backlight source for the liquid crystal display panel and the like. The arrangements may in particular follow those in the prior arts. The details are omitted herein.

It should be noted that all of drawings in the present disclosure are brief schematic views which are intended to show clearly the structures associated with keys of the embodiment of the present invention. The other structures which are not associated with the keys are the conventional structures. The other structures are not shown in the drawings or only parts of the other structures are shown in the drawings.

Although several exemplary embodiments have been shown and described, the present invention is not limited to those and it would be appreciated by those skilled in the art that various changes or modifications may be made in these embodiments without departing from the principles and spirit of the disclosure, the scope of which is defined in the claims and their equivalents.

What is claimed is:

1. An array substrate, comprising:
a base substrate;
signal lines located in positions on the base substrate corresponding to a display region of the array substrate, wherein the signal lines comprise gate lines;
data lines arranged to cross with the gate lines;
a driving integrated circuit unit located in a first position on the base substrate corresponding to a non-display region of the array substrate and close to a first end of each of the data lines, the driving integrated circuit unit comprising a source driving circuit unit;
a gate driver on array unit located in a second position on the base substrate corresponding to the non-display region of the array substrate and close to a second end of each of the data lines; and
a pattern layer, in which the signal lines are arranged; and
signal line wirings located between the pattern layer and the base substrate and arranged in the display region of the array substrate, wherein the signal line wirings include gate line wirings, and wherein the gate line wirings are configured to input gate scanning signals into the gate lines; and
gate line wiring connection lines arranged in the same layer as the gate line wirings, the gate line wiring connection lines being configured to connect the gate line wirings with the gate driver on array unit; and
gate scanning signal connection lines arranged in the same layer as the gate line wiring connection lines,
wherein the driving integrated circuit unit further comprises a gate driver on array signal unit, the gate scanning signal connection lines being configured to connect the gate driver on array unit with the gate driver on array signal unit, and
wherein the signal line wirings are configured to input signals into the signal lines.

2. The array substrate according to claim 1, wherein the pattern layer includes a first pattern layer in which the gate lines are arranged, and the array substrate further comprises:
a first insulation layer located between the first pattern layer and the base substrate, the gate line wirings being located between the first insulation layer and the base substrate,
wherein the first insulation layer is provided with first via holes therein, the first via holes being configured to connect the gate lines with the gate line wirings.

3. The array substrate according to claim 1, wherein the signal lines are composed of metal simple substance and/or metal alloy material, and
wherein the signal line wirings are covered by the signal lines in a direction perpendicular to a plane surface of the base substrate.

4. The array substrate according to claim 1, wherein the gate line wiring connection lines are composed of metal simple substance and/or metal alloy material, and
wherein the gate line wiring connection lines are parallel to the data lines and the parts of the gate line wiring connection lines overlapped with the data lines are covered by the data lines in a direction perpendicular to a plane surface of the base substrate.

5. The array substrate according to claim 1, wherein the gate scanning signal connection lines are composed of metal simple substance and/or metal alloy material, and
wherein the parts of the gate scanning signal connection lines overlapped with the data lines are covered by the data lines in a direction perpendicular to a plane surface of the base substrate.

6. The array substrate according to claim 1, further comprising:
data line leads configured to connect the data lines with the source driving circuit unit.

7. The array substrate according to claim 1, wherein the signal lines comprise data lines and the signal line wirings comprise data line wirings, and
wherein the data line leads are configured to input source driving signals into the data lines.

8. A display panel comprising an array substrate according to claim 1.

9. A display apparatus comprising a display panel according to claim 8.

10. An array substrate, comprising:
a base substrate;
signal lines located in positions on the base substrate corresponding to a display region of the array substrate, wherein the signal lines comprise gate lines;
a pattern layer, in which the signal lines are arranged; and
signal line wirings located between the pattern layer and the base substrate and arranged in the display region of the array substrate, wherein the signal line wirings include gate line wirings, and wherein the gate line wirings are configured to input gate scanning signals into the gate lines;
data lines arranged to cross with the gate lines;
a driving integrated circuit unit located in a position on the base substrate corresponding to a non-display region of the array substrate and close to any end of each of the data lines, the driving integrated circuit unit comprising a gate driving circuit unit and a source driving circuit unit; and
gate line wiring connection lines arranged in the same layer as the gate line wirings, the gate line wiring connection lines being configured to connect the gate line wirings with the gate driving circuit unit,
wherein the signal line wirings are configured to input signals into the signal lines.

11. The array substrate according to claim 10, wherein the gate line wiring connection lines are composed of metal simple substance and/or metal alloy material, and
wherein the gate line wiring connection lines are parallel to the data lines and the parts of the gate line wiring connection lines overlapped with the data lines are covered by the data lines in a direction perpendicular to a plane surface of the base substrate.

12. The array substrate according to claim 10, further comprising:
data line leads configured to connect the data lines with the source driving circuit unit.

13. A display panel comprising an array substrate according to claim 10.

14. A display apparatus comprising a display panel according to claim 13.

15. An array substrate, comprising:
a base substrate;
signal lines located in positions on the base substrate corresponding to a display region of the array substrate, wherein the signal lines comprise gate lines;
a pattern layer, in which the signal lines are arranged; and
signal line wirings located between the pattern layer and the base substrate and arranged in the display region of the array substrate, wherein the signal line wirings include gate line wirings, and wherein the gate line wirings are configured to input gate scanning signals into the gate lines;

a first insulation layer located between the first pattern layer and the base substrate, the gate line wirings being located between the first insulation layer and the base substrate, wherein the first insulation layer is provided with first via holes therein, the first via holes being configured to connect the gate lines with the gate line wirings;

data lines arranged to cross with the gate lines, the data lines and the gate lines delimiting a plurality of pixel regions;

organic light emitting units arranged in the pixel regions and configured to emit light in a top emitting mode with respect to the base substrate;

a second insulation layer located between the second pattern layer and the base substrate; and a gate driver on array unit located between the second insulation layer and the base substrate, wherein the second insulation layer is provided with second via holes therein, the second via holes being configured to connect the gate driver on array unit with the gate line wirings, wherein the signal line wirings are configured to input signals into the signal lines.

16. The array substrate according to claim 15, further comprising:

a driving integrated circuit unit located in a position on the base substrate corresponding to a non-display region of the array substrate and close to any end of each of the data lines, the driving integrated circuit unit comprising a source driving circuit unit and a gate driver on array signal unit; and gate scanning signal connection lines arranged in the same layer as the gate line wirings, the gate scanning signal connection lines being configured to connect the gate line wirings with the gate driver on array signal unit.

17. The array substrate according to claim 16, wherein the gate scanning signal connection lines are composed of metal simple substance and/or metal alloy material, and wherein the parts of the gate scanning signal connection lines overlapped with the data lines are covered by the data lines in a direction perpendicular to a plane surface of the base substrate.

18. The array substrate according to claim 16, further comprising:

data lines lead configured to connect the data lines with the source driving circuit unit.

19. A display panel comprising an array substrate according to claim 15.

20. A display apparatus comprising a display panel according to claim 19.

* * * * *